United States Patent [19]
Tonucci et al.

[11] Patent Number: 5,264,722
[45] Date of Patent: Nov. 23, 1993

[54] NANOCHANNEL GLASS MATRIX USED IN MAKING MESOSCOPIC STRUCTURES

[75] Inventors: Ronald J. Tonucci, Temple Hills, Md.; Brian L. Justus, Springfield, Va.

[73] Assignee: The United States of America as Represented by the Secretary of the Navy, Washington, D.C.

[21] Appl. No.: 897,638

[22] Filed: Jun. 12, 1992

[51] Int. Cl.⁵ .................. H01L 27/12; H01L 45/00; C03C 17/00; C03C 27/00
[52] U.S. Cl. ............................ 257/443; 257/461; 257/29; 65/31; 65/32.2; 65/42; 250/207
[58] Field of Search ................. 65/31, 32.2, 42; 257/29, 443, 461

[56] References Cited

U.S. PATENT DOCUMENTS

| | | | |
|---|---|---|---|
| 3,331,670 | 7/1967 | Cole | 65/32.2 |
| 4,021,216 | 5/1977 | Asam et al. | 65/31 |
| 4,101,303 | 7/1978 | Balkwill | 65/31 |
| 4,246,016 | 1/1981 | Siegmund | 65/31 |
| 4,606,960 | 8/1986 | Angel et al. | 65/42 |
| 4,853,020 | 8/1989 | Sink | 65/31 |
| 4,868,622 | 9/1989 | Shigenaka | 257/461 |
| 4,912,531 | 3/1990 | Reed et al. | 357/12 |
| 5,059,001 | 10/1991 | Shimizu | 359/24 |
| 5,159,231 | 10/1992 | Feller et al. | 250/207 |

Primary Examiner—Rolf Hille
Assistant Examiner—Mahshid Saadat
Attorney, Agent, or Firm—Thomas E. McDonnell; George A. Kap

[57] ABSTRACT

The present invention provides a method of forming a semiconductor device comprising the steps of:

forming a glass block of an acid inert glass having acid etchable glass rods extending therethrough, the acid etchable glass rods having an average diameter of less than 1 micron;

partially etching one end of the acid etchable rods surface of the glass block to form cavities in the glass block on one surface thereof having an average diameter of less than 1 micron;

depositing material(s) in the cavities to form a semiconductor device.

The present invention also provides a method for forming a semiconductor device in which the acid etchable glass rods are completely etched and the deposition material(s) is deposited to fill the nanochannels formed by the etching.

The present invention also provides semiconductor devices made by these methods.

20 Claims, 13 Drawing Sheets

Rectangular Array of Channels
Using Monofilaments a/b ratio 1.15:1

Hexagonal Array of Channels
Using Monofilaments a/b/c ratio 1:1:1

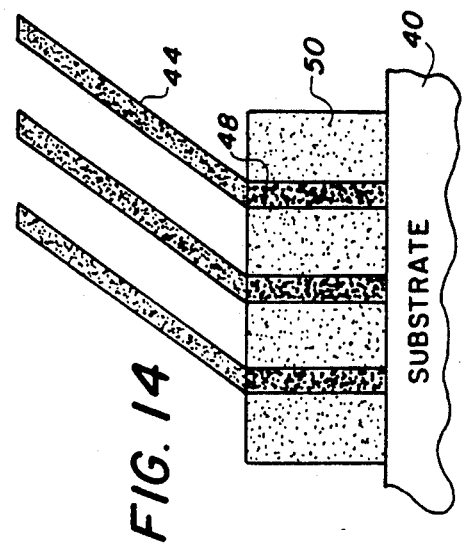
FIG. 13
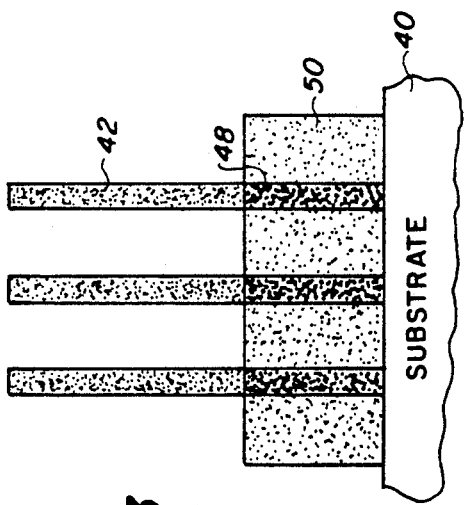
FIG. 14
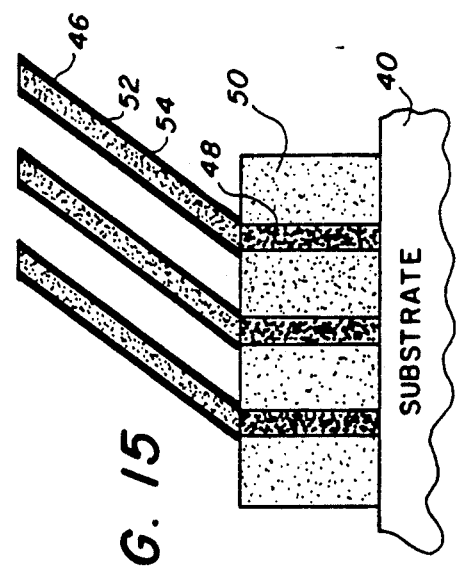
FIG. 15
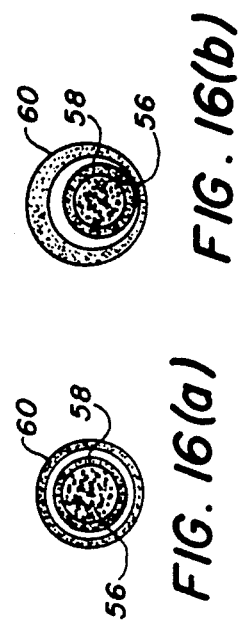
FIG. 16(a)
FIG. 16(b)

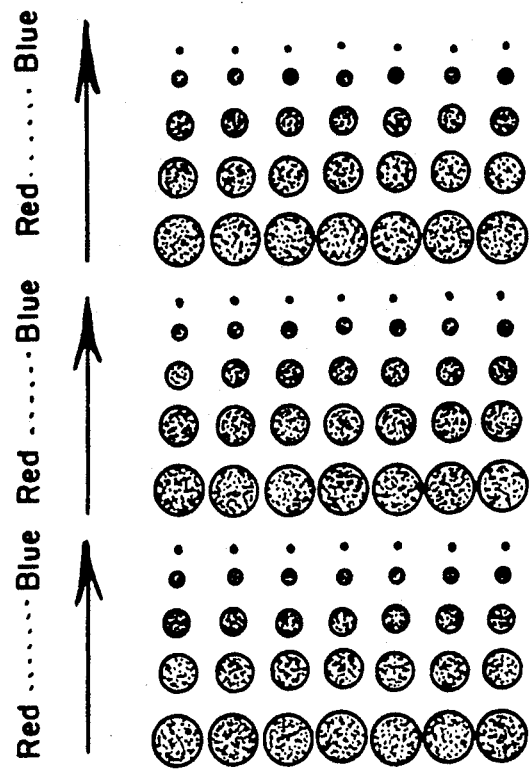
FIG. 27
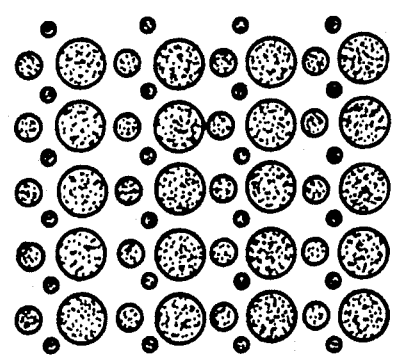
FIG. 26
FIG. 25

NANOCHANNEL GLASS MATRIX USED IN MAKING MESOSCOPIC STRUCTURES

BACKGROUND OF THE INVENTION

1. Field of the Invention

The present invention relates to the field of fabricating mesoscopic structures.

2. Prior Art

Considerable effort over the past two decades has been expended to develop techniques to fabricate mesoscopic materials (materials that exhibit unique quantum mechanical effects due to their ultrasmall dimensions but are still considered large on an atomic scale), usually embedded in a protective or interactive matrix. The constraints on size are highly dependent upon the specific application. However, the ultimate goal is to produce materials that can be engineered from macroscopic dimensions to atomic proportions in size. The quantum mechanical properties of mesoscopic materials are dominated by the effects of size confinement and, if the particles are close enough to each other, cooperative effects.

Quantum confinement refers to materials that have spatial dimensions small enough to exhibit properties which differ from those of the bulk material according to the laws of quantum mechanics. Examples of quantum confinement in semiconductor materials are quantum wells (confinement in one dimension), quantum wires (confinement in two dimensions) and quantum dots (confinement in three dimensions). Quantum confined systems have generated considerable interest in both basic research and commercial applications because of their unique electronic and optical properties and their potential for ultra small devices.

Cooperative effects between quantum confined systems refers to additional effects exhibited when quantum confined systems interact. A variety of methods are currently employed to fabricate such systems. However, only quantum well devices have met with any great success. Previous work on ordered arrays of quantum dots and wires that exhibit cooperative effects have suffered from a lack of uniformity in the array over length scales considered large compared to the size of an element in the array. Since the electronic properties, and hence the optical properties, of quantum confined systems generally change rapidly as a function of size and separation, this lack of uniformity tends to wash out any features due to cooperative effects. In addition, any enhancement gained from large numbers of identical particles will also be washed out. The variance in size and geometry also tends to make electronic device performance unpredictable and greatly reduces optical device efficiencies.

Devices that utilize tunneling of electrons or elementary excitations such as excitons, are very sensitive to barrier heights and widths. Arrays of tunneling devices that require identical barriers (i.e. identical device characteristics) then become extremely sensitive to the overall structure of the array in terms of the element dimensions, barrier widths, and positioning of the elements within the array.

Recent attempts at defining quantum confined arrays of wires or dots have relied on a variety of masking, etching and growth techniques. Due to the small size requirements for quantum confinement (often $<50$ nm), these processes usually contaminate the quantum confined material by damage or extraneous material deposition, which is generally detrimental to device performance. Where material damage is intentionally invoked to define the structure of the device, component boundaries tend to be vague, compromising large scale geometries. Arrays fabricated by controlled growth techniques over substrates, tend to be extremely labor and time intensive, and exhibit good uniformity over a relatively small region of the array. Chemical etching of free standing arrays utilizing masking techniques tend to be fragile and curve definition is extremely process and material dependent.

Supersaturation growth techniques are capable of producing very small microcrystalites (usually not greater than 10 nm) of II-VI and I-VII semiconductor material in glass hosts. Although these quantum dot systems are usually of excellent optical quality, the dots exhibit a random distribution of particle sizes suspended within the medium. In addition, there is no control over the position of individual particles. To date, they have found extensive use as optical color filters and have demonstrated an optical nonlinearity. However, they are of no immediate utility to the electronics industry.

SUMMARY OF THE INVENTION

The nanochannel glass matrix of the present invention provides a host matrix enabling simultaneous large scale complex patterning of nanometer sized elements with the accuracy and precision exceeding that of ion and electron beam direct writing (without the usual damage associated with these techniques). This complex glass structure can contain a large number of channels or pores (scaleable to $\geq 10^8$) in a variety of configurations, with pore sizes from microns to less than 100 Å, possesing excellent uniformity. Continuous arrays can be fabricated with packing densities as great as $10^{12}$ elements/cm$^2$. The high temperature stability of the nanochannel glass matrix makes nanometer scale deposition of materials viable in molecular beam epitaxy (MBE) type applications for the first time. In addition, a variety of high temperature chemical vapor deposition (CVD) techniques can also be used in the deposition process. Fabrication of a new class of materials and devices that rely on both the shift in energy due to quantum confinement and cooperative effects between quantum confined elements in large arrays can now be realized. These include quantum enhanced laser materials of bulk proportions with adjustable output frequencies dependent upon the degree of confinement, ultra small (quantum) electronic devices, nano-electrodes, site specific chemical catalysts, far infrared filters (derived from cooperative effects) and nonlinear optoelectronic devices.

In one embodiment, the present invention provides a method of forming a semiconductor device comprising the steps of:

forming a glass block of an acid inert glass having acid etchable glass rods extending therethrough, the acid etchable glass rods having an average diameter of less than 1 micron;

partially etching one end of the acid etchable rods surface of the glass block to form cavities in the glass block on one surface thereof having an average diameter of less than 1 micron;

depositing a first deposition material in the cavities to form a semiconductor device.

In another embodiment, the present invention provides a method of forming a semiconductor device comprising the steps of:

forming a glass block of an acid inert glass having acid etchable glass rods extending therethrough, the acid etchable glass rods having an average diameter of less than 1 micron;

etching the acid etchable rods in the glass block to form channels therethrough having an average diameter of less than 1 micron;

depositing semiconductor material in the channels to substantially fill the channels and form an oriented array of semiconductor material.

The present invention also provides semiconductor devices made by the above methods.

BRIEF DESCRIPTION OF DRAWINGS

FIG. 13 illustrates channels filled with oriented crystalline material followed by vertical whisker growth.

FIG. 14 illustrates channels filled with oriented crystalline material followed by quantum wire growth with substrate <111> plane 45° from vertical.

FIG. 15 illustrates dissimilar materials deposited on quantum wires after quantum wire growth forming a quantum tube structure.

FIG. 16(a) is a cross-sectional view of multilayered quantum tubes showing symmetrical deposition of a semiconductor material.

FIG. 16(b) is a cross-sectional view of multilayered quantum tubes showing asymmetrical deposition of a semiconductor material.

FIG. 25 illustrates a set of three quantum confined elements where the degree of confinement corresponds to red, green and blue emission.

FIG. 26 illustrates an array of the elements of FIG. 25.

FIG. 27 illustrates another array of quantum confined elements.

DETAILED DESCRIPTION OF THE INVENTION

The nanochannel glass matrix of the present invention is a host or cast for the deposition of a variety of materials. The body of the glass is a patterned arrangement of channels or holes whose dimensions can be controlled to as small as a few nanometers. The nanochannel glass matrix is designed to allow mesoscopic structures to be easily fabricated in a multitude of complex configurations by depositing a variety of materials into the nanochannel glass matrix.

In one embodiment of the invention, the glass matrix is formed as a uniform array of equally spaced rods of acid etchable glass in a hexagonal 2-dimensional close packing arrangement. The hexagonal close packing arrangement of hexagonal glass fibers, with acid etchable channels of greater than 1 micron is a well known technology and is frequently used in the first processing step of microchannel plate.

Figure 2:
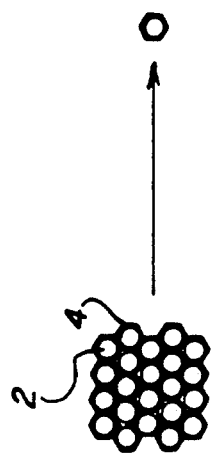
FIG. 2 illustrates stacked rods which have been redrawn several times.
Figure 3:
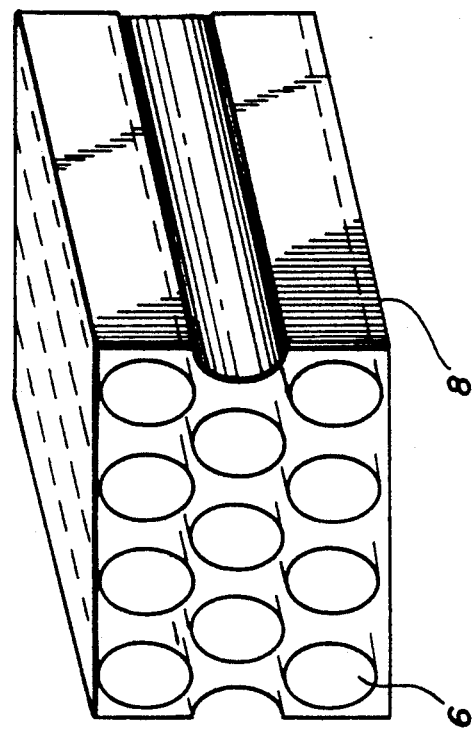
FIG. 3 is a right perspective view of a glass matrix of the invention.
Figure 1:
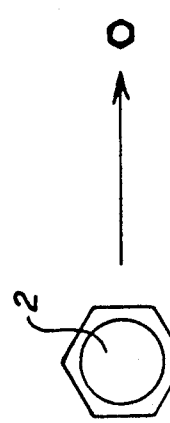
FIG. 1 illustrates the reduction in size of an acid etchable rod inside a hollow inert glass rod.
Figure 4:
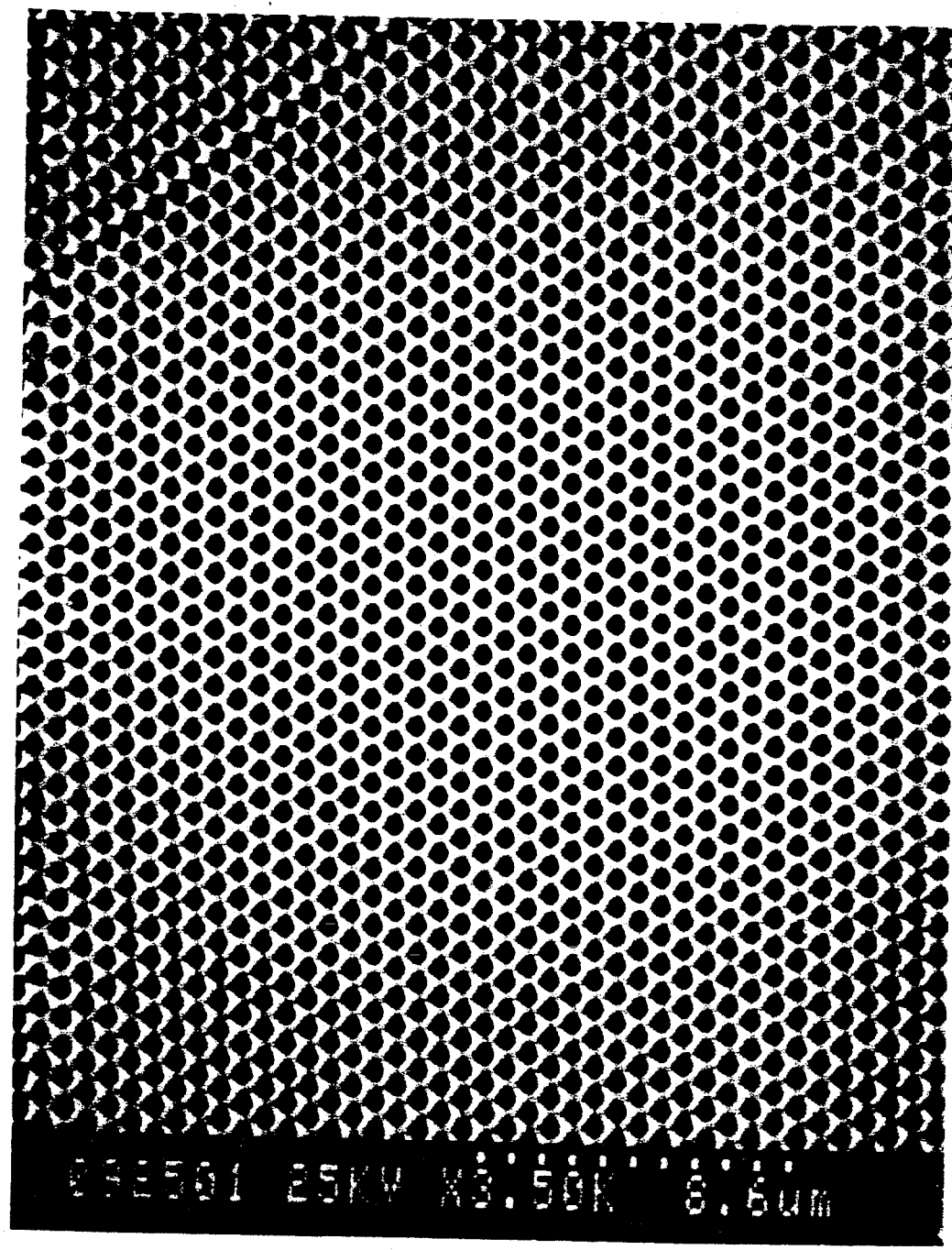
FIG. 4 is a scanning electron micrograph of a glass matrix made according to the present invention having 450 nanometer channel diameters.
Figure 5:
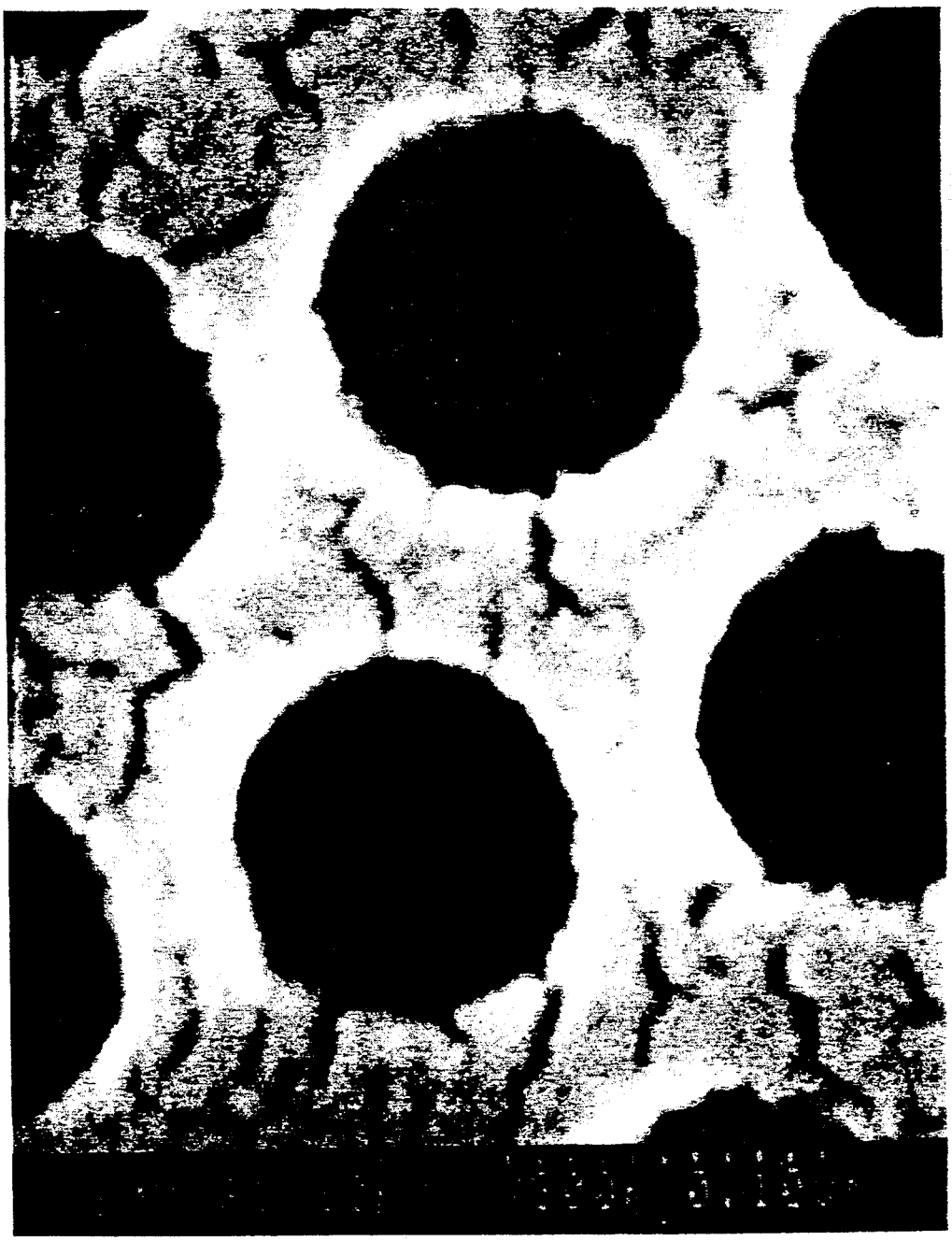
FIG. 5 is a scanning electron micrograph of a glass matrix of the present invention having 90 nanometer channel diameters.
Figure 6:
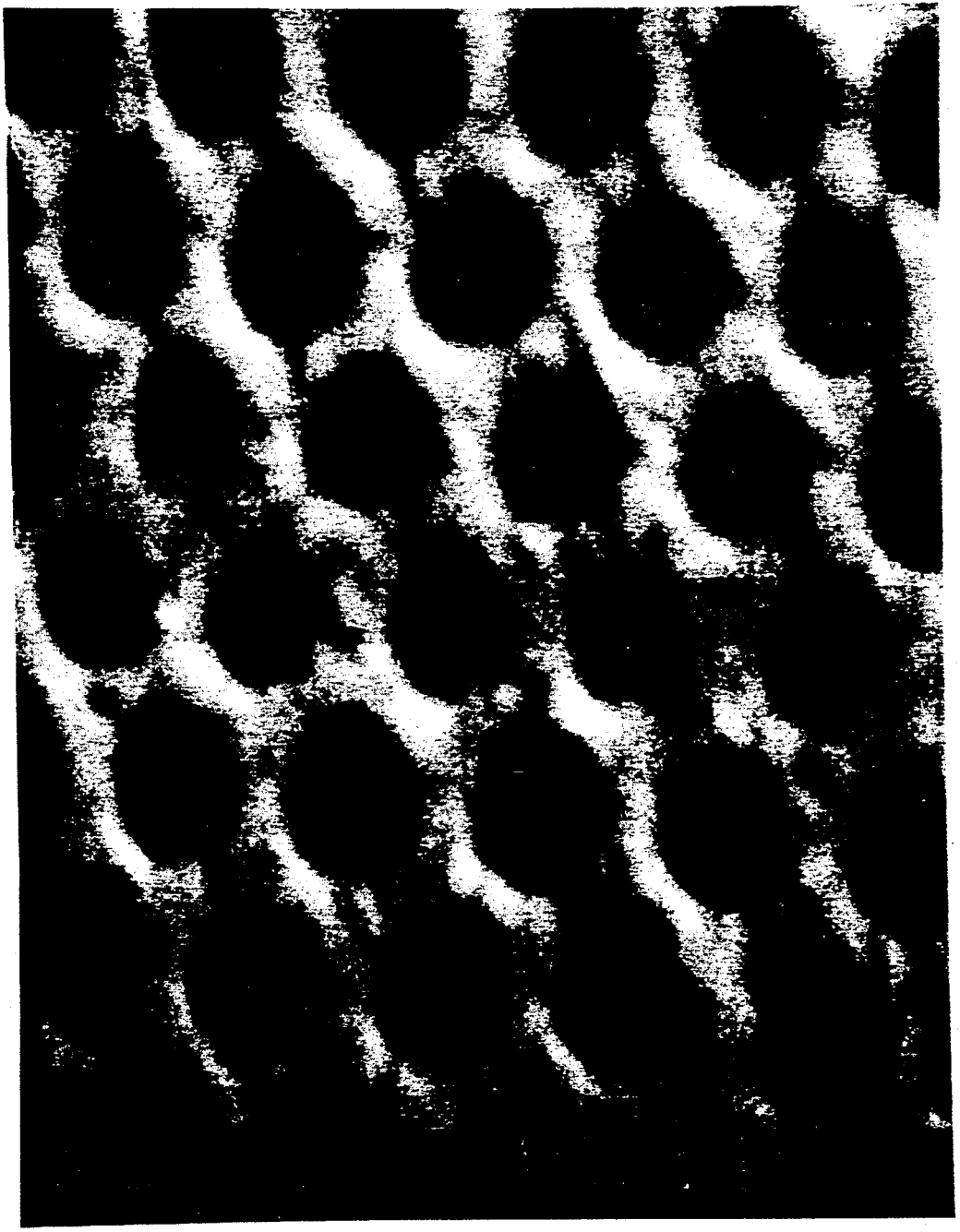
FIG. 6 is a scanning electron micrograph of a glass matrix made according to the present invention having 40 nanometer channel diameters.

As is shown in FIG. 1, fabrication starts by insertion of a cylindrical acid etchable glass rod 2, the channel glass, into an inert hexagonal glass tube 4, the matrix glass, whose inner dimensions match that of the rod. The pair is then fused by heating the glasses close to the melting point. The pair is then drawn to reduce the overall cross-section to that of a fine filament. The filaments are then stacked, fused again and redrawn as is shown in FIG. 2. This process is continued until appropriate channel diameters and the desired number of array elements are achieved. Annealing of the glasses is necessary if the glasses chosen are susceptible to work hardening. By adjusting the ratio of the diameter of the etchable glass rod to that of the outside dimension of the hexagonal inert glass tubing, the center to center spacing of the rods and their diameters in the finished product become independently adjustable parameters. A section of the final product is shown in FIG. 3 in which channels 6 extend through a matrix 8. FIG. 4 shows a scanning electron micrograph (SEM) of a hexagonal close packing (HCP) arrangement of channel glasses in relief after acid etching. The sample contains approximately $5 \times 10^6$ channels arranged in a highly regular two dimensional array. The channels are extremely uniform in size throughout the entire area of the array with a diameter of approximately 450 nanometers and the center to center spacing is approximately 750 nanometers. FIG. 5 shows a similar SEM micrograph with 90 nanometer channel diameters. FIG. 6 also shows an SEM micrograph but with 40 nanometer channel diameters. The rough appearance of the channel boundaries and apparent cracking of the surface is due to the approximately 8 nanometer thick incomplete layer of gold deposited on the nanochannel glass matrix surface to avoid charging effects during SEM analysis and is not indicative of the nanochannel glass matrix itself.

The fabrication process is very suitable to mass production requirements. The wafer-like nanochannel glass matrix is generally only a few millimeters thick and is sectioned from a fused matrix bar several feet long. The fused matrix bar is cut from a longer matrix bar which continuously flows from the final drawing process. Up to 100 feet of identical fused matrix bar can be fabricated in a single run, from which more than 50,000 identical nanochannel glass matrices can be cut. In order to produce a glass matrix which can withstand the acid etching treatment, after the wafer-like glass matrix has been cut from the fused stack of fibers, the glass matrix should be annealed at an elevated temperature, preferably about 425° C. for about 2 hours in order to relieve stress in the matrix.

By adjusting the geometry of the outer wall of the tubing so that it has a square, rectangular, triangular, etc. cross-section, the packing arrangement or geometry of the array can be adjusted. Also, by adjusting the shape of the circumference of the channel glass, the channel shape can be altered. More intricate patterns can be fabricated by stacking dissimilar filaments next to each other. The fabrication process for the nanochannel glass matrix of the present invention yields extremely regular channels whose diameters are adjustable in size from microns to several nanometers.

In order to allow for etching of channels as small as those used in the present invention, the difference between the relative etch rates of the etchable glass and the inert glass needs to be very large. While in porous glass having larger pore sizes, the etch rate of the etchable glass is 1,000 to 10,000 times the etch rate of the inert glass, in the present invention, the etch rate of the etchable glass is preferably $10^5$ to $10^7$ the etch rate of the inert glass. Because of the microscopic size of the channels formed in the glass matrix, it is also important that the two glasses not diffuse into each other while they are drawn. Therefore, a minimum of heat and time should be used while the glasses are being drawn. Although the exact drawing temperature is dependent on the glasses used, the drawing temperature is generally between 625° and 750° C. A preferred inert glass is Corning Glass 0120, 8161 or 0080. Corning Glass 0120 is a potash soda lead glass. Preferred etchable glasses are EG-1, EG-2 and EG-4 manufactured by Detector Technology. Using Corning Glass 0120 as the inert glass and EG2 as the etchable glass, glass matrices have been prepared having average channel diameters of less than 400 Å, preferably less than 100 Å.

Preferably, although acids such as nitric acid and hydrochloric acid can be used to etch the acid etchable glass, the acid used in the acid etching of the etchable glass is preferably an organic acid such as acetic acid which does not leave a residue on the acid inert glass. Preferably, the acid etching solution is at a concentration of 0.1 to 2%.

Figure 7A:
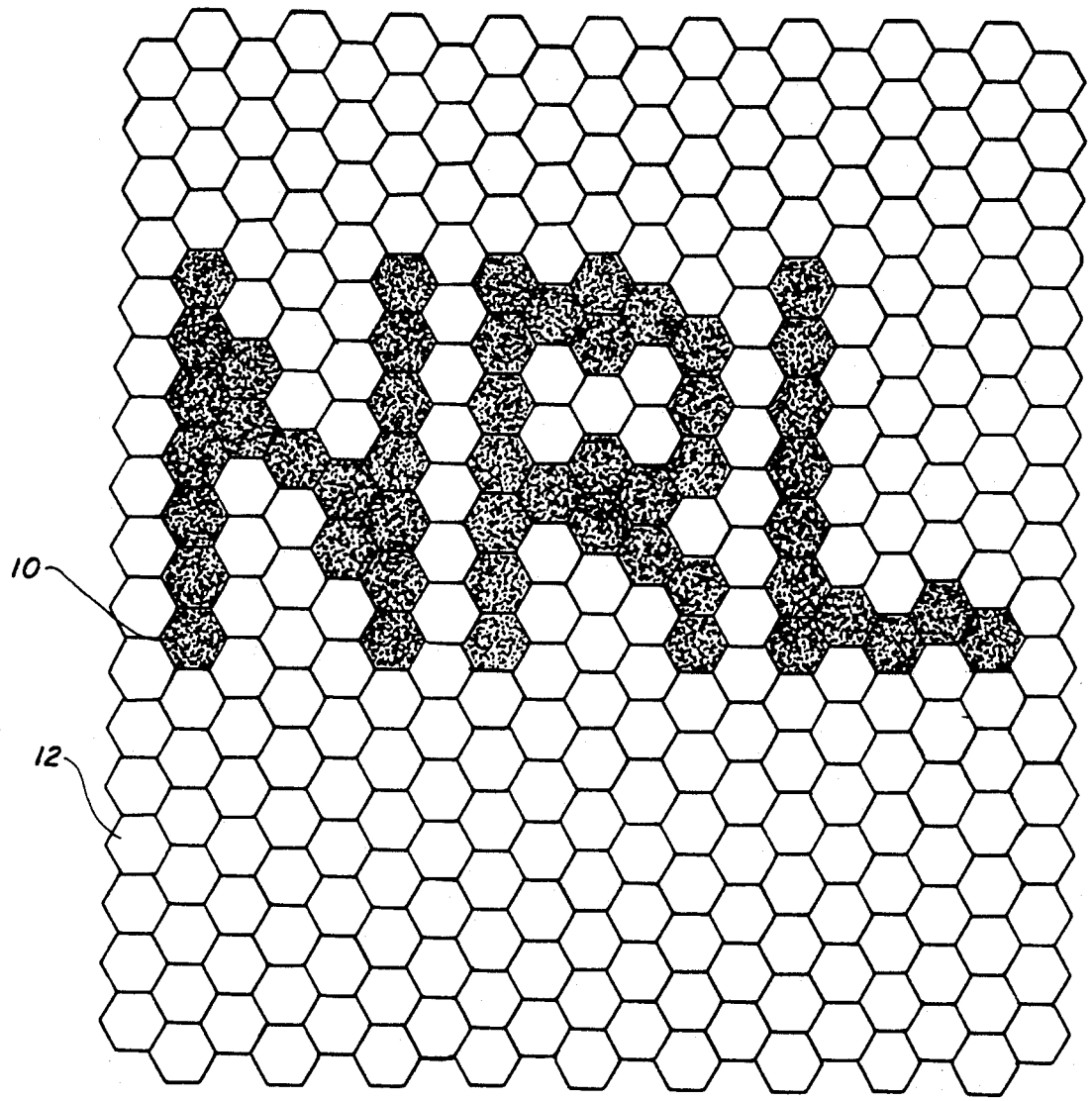
FIG. 7(a) is a top plan view of a nanochannel glass matrix composed of solid homogeneous hexagonal rods of either etchable or inert glass showing connecting structures.
Figure 7B:
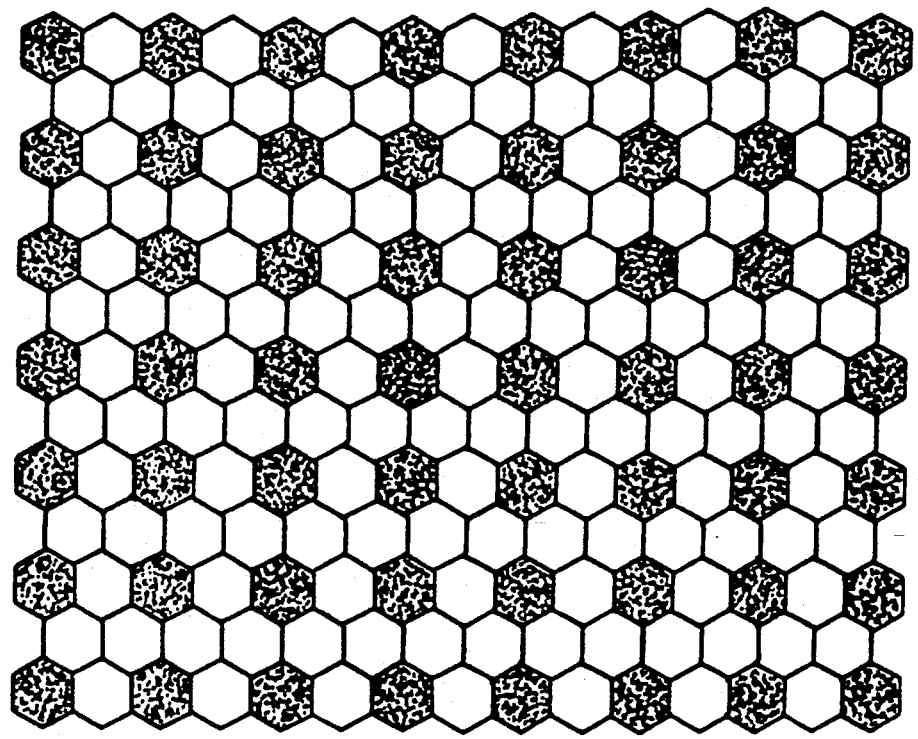
FIG. 7(b) is a top view of a nanochannel mask of solid homogeneous hexagonal rods of either acid-etchable or inert glass demonstrating a square array.
Figure 7C:
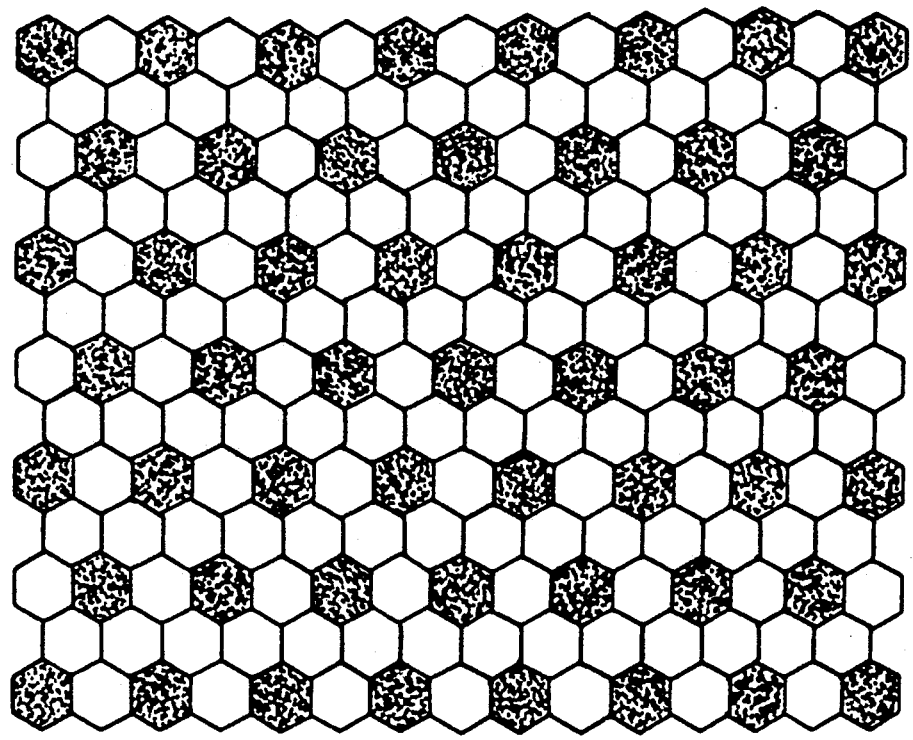
FIG. 7(c) is a top view of a nanochannel mask composed of solid homogeneous hexagonal rods of either acid-etchable or inert glass demonstrating a hexagonal array.
Figure 7E:
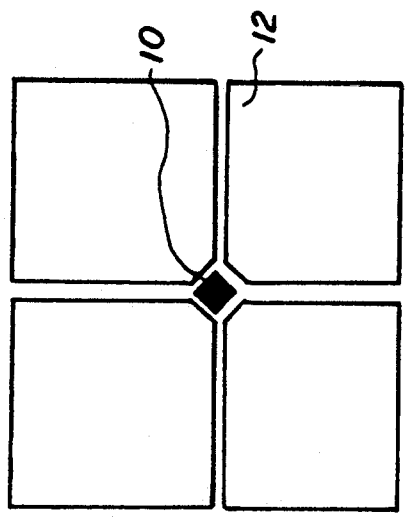
FIG. 7(e) is an alternate embodiment showing the use of solid rods of inert acid-etchable glasses in a square configuration.
Figure 7D:
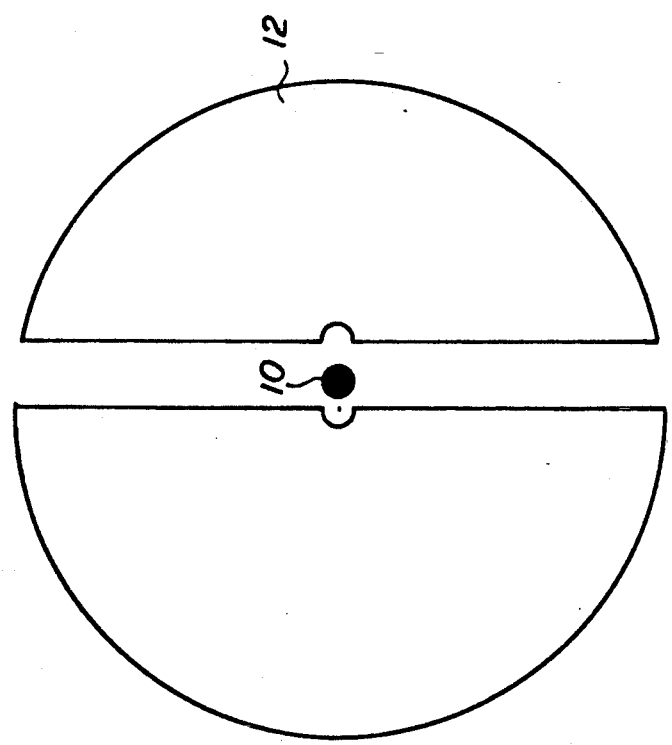
FIG. 7(d) is an alternate embodiment showing the use of solid rods of inert acid-etchable glasses in a split D configuration.
Figure 7F:
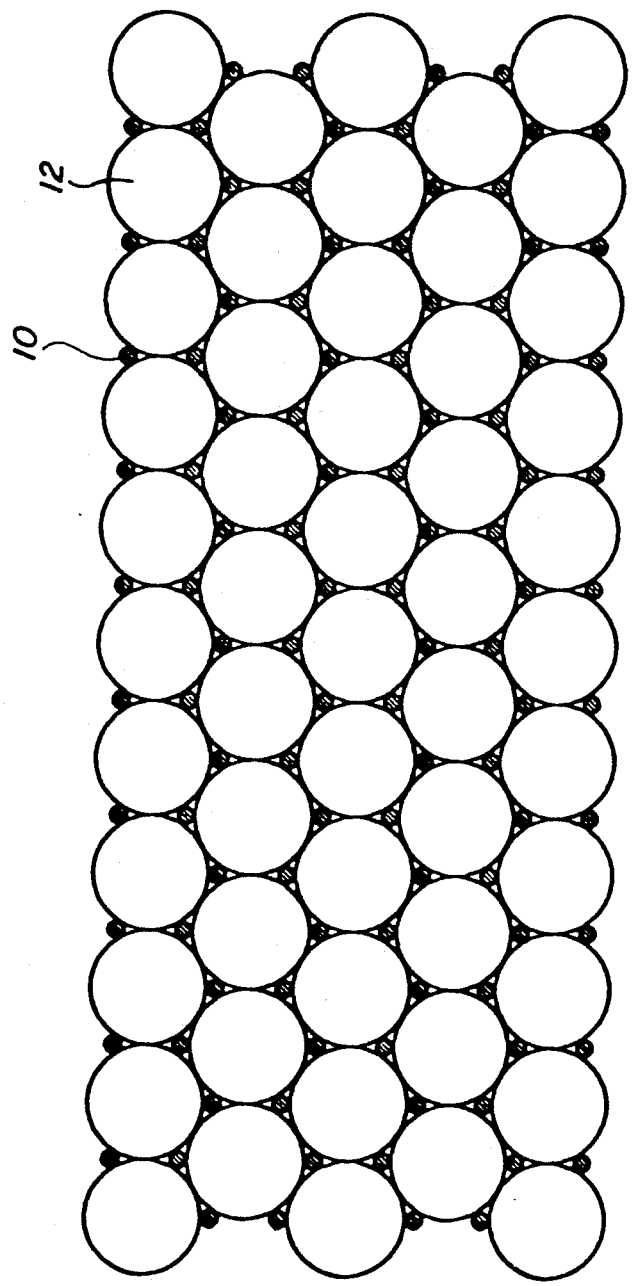
FIG. 7(f) is an alternate embodiment showing the use of solid rods of different sizes wherein the rods are either inert or acid-etchable.

In another embodiment of the nanochannel glass matrix, an array is composed of solid homogeneous hexagonal rods of either etchable or inert glass. An example of such a glass matrix with interconnecting structures is illustrated in FIG. 7(a). FIG. 7(b) demonstrates a square array of channels and FIG. 7(c) demonstrates a hexagonal array of channels. In another embodiment, fabrication of nanochannel glass includes the step of extruding a D-shaped rod with a small groove along the center of the flat face, as shown on FIG. 7(d). For tighter tolerances, the groove may be cut instead of being formed by the die used in the extrusion to make the D-shaped rod. An acid-etchable glass fiber or rod drawn down to 100 microns in diameter or smaller is placed in the groove of the D-shaped rod and another D-shaped rod is attached. The rods are stacked for drawing sequences as already described. Nanometer dimensions of the channel diameters can now be accomplished in just two additional draws, minimizing the interdiffusion of the glass types. Extremely smooth, high definition channel walls can be fabricated in this fashion. The matrix glass chosen for the D-shaped rod must have a lower working temperature than the etchable fiber so the matrix can flow and close the area around the fiber during the vacuum drawing process without fiber distortion. In practice, a hexagonal rod is used since it has a closed packing geometry. As earlier, dark regions are composed of acid-etchable pixels or rods 10 and the light regions are composed of inert pixels or glass rods 12. In another embodiment, the fabrication method utilizes the radius of the corners of long glass bars with rectangular or square cross-sections. FIG. 7(e) illustrates the square embodiment with dark regions composed of acid-etchable pixels or rods 10 and light regions composed of inert pixels or glass rods 12. The edges can be ground for greater accuracy. The assembly is clamped and drawn under vacuum to produce a fine square filament. The filaments can be restacked and redrawn or combined with other materials in a predetermined complex pattern. As before, channel diameters with nanometer dimensions can be fabricated in just two draws, thus greatly reducing the time the dissimilar glasses are in contact at elevated temperatures. Any other close packing geometry of glass bars, such as triangular, hexagonal, etc., can also be used. In still another embodiment, illustrated in FIG.

7(f), nanochannel glass is fabricated using solid bars 10 of acid-etchable glass in between much larger rods 12 of inert glass. The dark regions are composed of acid etchable pixels or rods 10 and the light regions are composed of inert pixels or rods 12. Squares, slabs and other structures can be inserted into the matrix if the physical properties (melting point viscosity at working temperatures, thermal expansion coefficient, etc.) of the inserted glass are chosen properly. Many other, more complex and intricate patterns are possible during the nanochannel glass matrix fabrication process. Examples of how the nanochannel glass matrix can be used in conjunction with semiconductor and metal deposition for device fabrication are described below.

Quantum confined semiconductor systems have exhibited a variety of electronic optical and electro-optical effects whose origins are directly traceable to the degree of quantum confinement. Semiconductor material, such as the II-VI and III-IV groups with large effective exciton Bohr radii ($a_b \approx 10$ nm-200 nm), deposited in small diameter channels clearly fall into the regime of quantum wires and dots, depending upon the depth of the channel. In addition, arrays of quantum confined elements are predicted to exhibit cooperative effects if the elements are sufficiently close. Changing the size of the channel that the semiconductor will be grown in varies the degree of quantum confinement and, hence, determines in a predictable way the change in the electronic and optical properties of the quantum confined materials. Cooperative effects between array elements of a given size may be varied independently. The precision and accuracy of the nanochannel glass matrix channel dimensions and their placement make the nanochannel glass matrix an ideal host for such devices.

Figure 8:
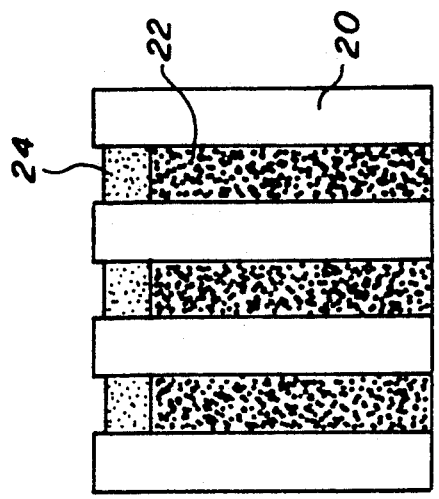
FIG. 8 illustrates the shallow etching of channels and the subsequent deposition of semiconductor material to produce quantum dot arrays.

As an example which demonstrates many of the features of the nanochannel glass matrix as a host, the array configuration will again be used. Shallow etching of a nanochannel glass matrix array to form cavities in the glass matrix and subsequent chemical vapor deposition (CVD) of semiconductor material into the channels to form a quantum dot array is shown in FIG. 8. The quantum dot array comprises a nanochannel glass matrix 20 of inert glass, partially etched etchable glass 22 and deposited semiconductor material or quantum dots 24.

Figure 9A:
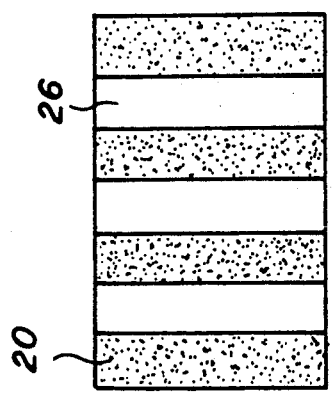
FIG. 9(a) illustrates a nanochannel glass matrix prior to etching.
Figure 9B:
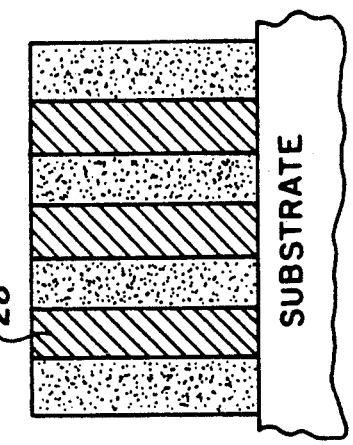
FIG. 9(b) illustrates a nanochannel glass matrix after being etched to form channels therethrough.
Figure 10:
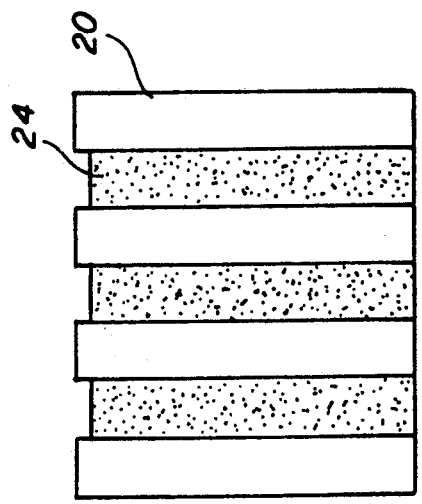
FIG. 10 illustrates the deep etching of channels and the subsequent depositions of semiconductor material to produce quantum wire arrays.

Quantum wires are fabricated in a similar way by deep etching the glass matrix to form channels 26 as shown in FIGS. 9(a) and 9(b) and filling the channels 26 as shown in FIG. 10 with semiconductor material or quantum wires 124. Where surface interactions of the semiconductor with the nanochannel glass matrix are important, precoating the channels 26 with other materials, such as an AlAs channel lining before GaAs deposition, may be required. Also, a thin metallic coating surrounding the quantum confined material can greatly enhance the nonlinear optical properties of the system. Such a thin layer may be deposited by CVD methods or by evaporation. The high temperature melting point of the nanochannel glass matrix is ideally suited for CVD techniques where the elevated temperatures are needed to drive chemical reactions to completion and to anneal deposited material to form single crystals.

Figure 11:
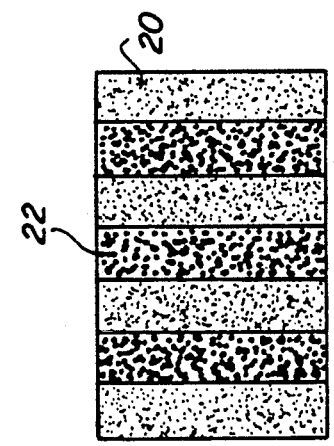
FIG. 11 illustrates a nanochannel glass matrix attached to a substrate.
Figure 12:
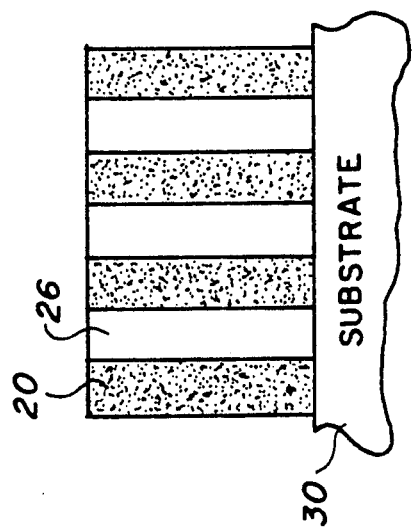
FIG. 12 illustrate the nanochannel glass matrix of FIG. 11 filled with oriented crystalline material having the same orientation as the substrate.

In the CVD method of deposition, crystals formed will be randomly oriented in neighboring channels. Depending upon the crystal system that the semiconductor material belongs to, a variety of cooperative effects may be greatly enhanced if the crystallographic orientations of the material in all of the channels are correlated. In many cases, optimization of nonlinear optical properties also requires these crystallographic correlations. Such a quantum wire or quantum dot device may be fabricated as shown in FIGS. 11 and 12. For example, by depositing GaAs 28 epitaxially into channels 26 over a GaAs or AlGaAs base 30 and filling the channels completely, every quantum confined crystal filling the channel will have the exact same crystallographic orientation. More complicated configurations include quantum well and multiple quantum well growth structures within the channels which form the basis for array lasers (emission parallel or perpendicular to plane of the array). The substrate can be removed leaving an array of identical single crystals in the optically transparent nanochannel glass matrix host. The high melting point of the nanochannel glass matrix allows this fabrication method to be utilized by any semiconductor system for which MBE methods have been established (within the temperature ranges of the nanochannel glass matrix).

Once an oriented array of the semiconductor wires in the glass matrix is established, the formation of orderer quantum wires (whiskers) and tubes can be fabricated by a regrowth process similar to that describe by M. Yazawa, Appl. Phys. Lett., 58 (10), p. 1080 (1991), the entire contents and disclosure of which is hereby incorporated by reference, in which 20 nm quantum wires of InAs were randomly grown over a GaAs substrate. As is shown in FIGS. 13, 14 and 15, by changing the crystallographic orientation of substrate 40, it is possible to change the angle of the growth of quantum wires 42 and 44 and tubes 46 effectively changing the distance between elements 48 in array 50. Hence cooperative effects can be changed in a predictable way merely by changing the substrate crystallographic orientation and the array can be used to generate a coherent phase locked light. Arrays of quantum tubes 46 are fabricated by depositing dissimilar materials 52 over quantum wires 54 after quantum wires 54 have grown, as shown in FIG. 15. After InAs quantum wire growth, a layer of AlSb can be deposited over the InAs forming a quantum tube. Extensions of this technique include depositing several layers 58 and 60 of semiconductor material over a quantum whisker 56 to form a series of nested cylinders of successively smaller diameter cylinders as shown in FIG. 16a and 16b to trap excitons or carriers within different layers. The deposition of semiconductor material can be either symmetrical, so that the thus formed nested cylinders are concentrically arranged (as shown in FIG. 16a), or asymmetrical, so that the thus formed nested cylinders are eccentrically (i.e., non-concentrically) arranged (as shown in FIG. 16b). An example of such a deposition, from center outwards would be InAs→AlSb→GaSb→AlSb. By controlling the AlSb thickness, tunneling devices between the InAs and GaSb layers can be fabricated and by controlling the positions of the array elements, cooperative effects between quantum tubes can be independently varied. Changing the growth parameters, such as by lowering the deposition temperature and controlling the direction of material flow, allows an asymmetric deposition of materials forming the tube, further confining excitations to one side of the tube. This allows finer control in customizing interactions within the tubes, as well as between tubes, in device design.

Another interesting feature of the nanochannel glass matrix is its use in an inversion fabrication process.

Although many configurations are possible, the array configuration will again be used as an example. In this fabrication process, the glass forming the channels is composed of an etchable glass with etchable rate $R_1$ and a matrix glass with an etchable rate $R_2$, where $R_2 > R_1$. The matrix glass is then removed by acid etching and an appropriate material, such as metal or semiconductor, is deposited in its place. The channel glass may then be etched away leaving a cast of the original material. Additional materials, such as semiconductors or metals, can then be deposited into the empty channels for further device fabrication or the channels can be left open to form an anti-quantum dot or wire array. Suitable glasses for the nanochannel glass inversion fabrication process have been tested with a range of values for $R_2/R_1$ between $2 \times 10^3$ and $6 \times 10^6$.

In device fabrication where the electric conductivity of the nanochannel glass matrix is important, the conductivity of the nanochannel glass matrix containing a supersaturation of excess metal ions can be controlled. Heat treatment of the glass causes the metal ions to come out of solution, increasing the conductivity of the glass in a predictable way. This allows considerable flexibility during the fabrication and design process of electronic and electro-optic devices, greatly enhancing the utility of the nanochannel glass matrix.

There are a variety of more complex configurations of the nanochannel glass matrix. It is possible to deposit multiple materials (conductors, semiconductors and insulating materials) within, on top of, and around the nanochannel glass matrix channels to form numerous devices. Examples include high resolution near field array detectors and emitters, nanoelectrodes, optical filters, metal insulator semiconductor (MIS) devices, a subminiature phased array antenna capable of examining photon fields on an atomic scale, site selective catalytic streaming, novel flat screen color monitors, micro laser arrays, optical demultiplexers and others.

To demonstrate some of these features, the array configuration will again be used. FIGS. 17, 18, 19 and 20 show a dissimilar deposition along the directions of channels 70 of a nanochannel glass matrix 72. A coating 74 is placed on the bottom of the matrix 72 which protects matrix 72 and channels 70. The top of the matrix 72 is then exposed to the etching process and channel material 76 is partially removed to form cavities 78. A first material 80 is then deposited in the cavities and a coating (not shown) can be added to the top if further protection is necessary. After removal of the bottom protective coating 74, the bottom portion of channels 70 can be etched and additional materials 82 deposited into cavities 84. Diode arrays, PIN diode arrays (by leaving a thin section of glass between dissimilar channel materials), a near field spatial non-optical array microscope (based on non-radiative energy transfer mechanisms between the system under discussion and the array material), MIS arrays, etc, can be fabricated by this method, especially if materials such as ITO (a transparent conductor) is used as contact materials. Using metal as the second material to be deposited into the channels allows making ultrafine electric connections.

Figure 22:
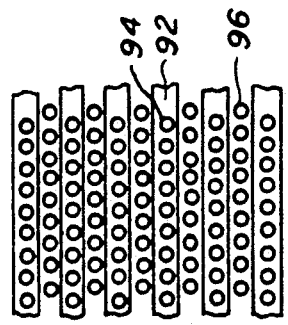
FIG. 22 illustrates protective photoresist strips laid down on alternating rows of etchable rods of the nanochannel glass matrix of FIG. 19.
Figure 24:
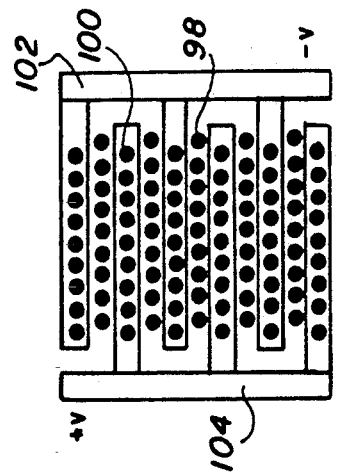
FIG. 24 illustrates removing the photoresist strips, etching the previously masked etchable rods, filling the resulting second channels with a second semiconductor material and adding respective contacts connected to the first and second semiconductor materials.
Figure 21:
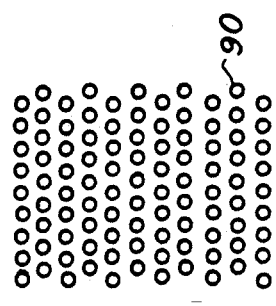
FIG. 21 is a top view of nanochannel glass matrix prior to etching.
Figure 23:
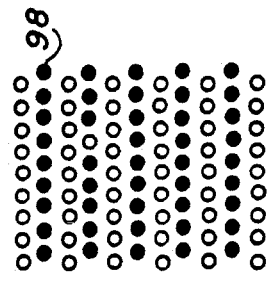
FIG. 23 illustrates etching the exposed etchable rods of the glass matrix of FIG. 22 and filling the resulting channels with a first semiconductor material.
Figure 18:
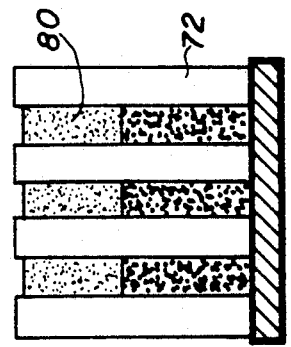
FIG. 18 illustrates semiconductor material deposited into the cavities in the nanochannel glass matrix.
Figure 20:
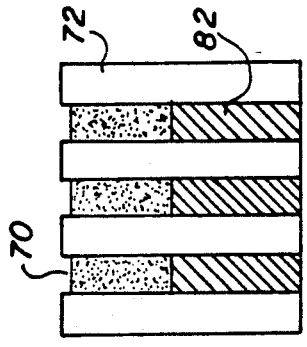
FIG. 20 illustrates filling the second set of cavities with a semiconductor material different form the first semiconductor material.
Figure 17:
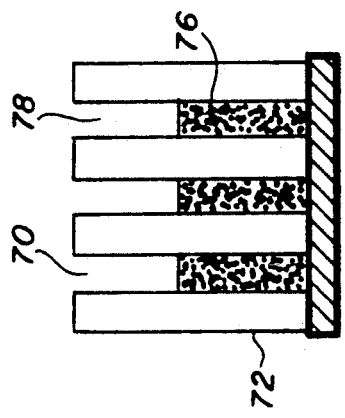
FIG. 17 illustrates a glass matrix etched with a protective coating on the bottom of the nanochannel glass matrix.
Figure 19:
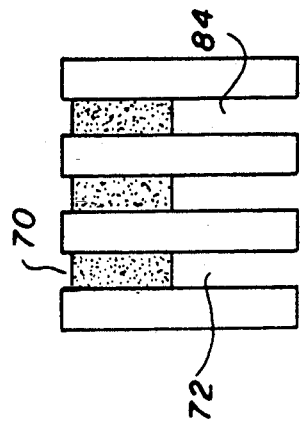
FIG. 19 illustrates the etching of a second surface of the nanochannel glass matrix to form a second set of cavities after removing the protective coating from the bottom of the nanochannel glass matrix.

FIGS. 21, 22, 23 and 24 show a material deposition process in which individual or groups of nanochannel glass matrix channels 90 can accept dissimilar materials. A protective coating or mask 92 is placed on channels 94 to mask channels 94 prior to the etching of etchable glass from exposed channels 96. In FIG. 22, a stripe configuration coating is used over alternating rows. The exposed channels 96 are etched and material 98, which in this example is a semiconductor material, is deposited into the channels 96. Protective coating 92 is removed and remaining channels 94 are etched and a different material 100, in this example a metal, is deposited into the newly exposed channels 94. Further processing allows for other materials such as contacts 102 and 104 to be deposited on top of the structure as shown in FIG. 24. If contacts are made to the metal filled channels of FIG. 24 in alternating rows at 60° to that shown, it is possible to fabricate a quadrapole field with an extremely high field gradient. This field gradient can be sufficiently strong to force biexcitons to lie in a plane, placing additional constraint on the quantum system. Tunable biexciton field gradient interactions open the possibility for extremely fast optical switches. The small spacing possible between array elements indicates tunneling and MIS devices can also be fabricated by this process.

Ultrahigh resolution flat screen color monitors, televisions, can be fabricated by the use of a single quantum confined semiconductor material as shown in FIGS. 25 and 26. Array channel diameters, in sets of 3, can be made such that shifts in the luminescence due to confinement would correspond to red, green and blue emission. Similarly, by making a multitude of selectively different channel diameters contained within the array, shifts in the absorption/emission due to quantum confinement can be utilized in fabricating optical demultiplexers (temporal dispersionless, ultrasmall optical spectrometers with broad band simultaneous monitoring) and multiplexers for use in optic fiber communications, VLSI chip interfaces (wireless I/O), and other devices. Array diameters can be made as small as a few microns and contain a wide variety of channel dimensions making direct demultiplexing of single mode optic fibers with a single, 5 micron, device possible. In this example, each channel, or set of channels, is made to correspond to a different frequency of light by changing the degree of confinement as is shown in FIG. 27. A variant on this theme of multiple confinement of channels can be used to design optical absorption or transmission notch band pass filters where one or several narrow bands exist. Because of the large absorption coefficient for many of the semiconductor materials available, these filters can be very efficient in the portion of the spectrum to be blocked.

Growth of single crystals of a metal along the channels by a method similar to the MBE configuration described above, makes possible the fabrication of nanoelectrodes utilizing ballistic transport of electrons. The array configuration of metal wires also makes possible a short wavelength subminiature phased array antenna. Since information on both the phase and direction of the photon field can be acquired, it may be possible to map the photon field from sources approaching the atomic level. The nano-array antenna can also be used to directionally transmit a coherent field of photons.

The nanochannel glass matrix of the present invention combines the ease of simultaneous large scale ($>10^7$ elements) complex patterning of nanometer sized elements with the accuracy and precision of ion and electron beam direct writing, without the usual substrate damage associated with these techniques. The high temperature stability of the nanochannel glass matrix makes nanometer scale deposition viable in MBE type applications for the first time. In addition, a variety of high temperature CVD techniques can also be used in the deposition process. Fabrication of a new class of materials and devices that rely on both the shift in energy due to quantum confinement and cooperative effects between quantum confined elements in large arrays can now be realized. These include quantum enhanced laser materials of bulk proportions with adjustable output frequencies dependent upon the degree of confinement, ultrasmall (quantum) electronic devices, far infrared filters (derived from cooperative effects) and nonlinear optoelectronic devices, to name a few. In addition, quantum confinement generally increases oscillator strengths and reduces effective lifetimes which indicates these materials may ultimately be used in highly efficient ultrafast applications.

Among the unique properties of the nanochannel glass matrix of the present invention are the high temperature stability of the glass, the very small size of the channels and the accuracy and precision to which these small channels can be arranged to form very large and complex structures. Inverse patterning allows construction of multiple materials on a nanometer scale. In addition to a pixel mode of pattern fabrication shown in FIG. 7(a), regular arrays and other structures can be fabricated with extremely good geometric uniformity and very low variance in channel dimensions. Channel and pixel packing densities can approach $10^{12}/cm^2$ and channel diameters can be made under 10 nanometers with great precision.

The formation of the nanochannel glass matrix will now be described by way of the following examples.

EXAMPLE I

The inert glass used was a hexagonal tube of Corning 0120 glass. The etchable glass used was Detector Technology's EG-2. The glasses were fused under vacuum during the drawing process at a temperature of 625° to 750° C. and were drawn down to fine filaments of 0.01 to 0.2 inches (0.03 to 0.5 cm) and cut to lengths of 1 to 3 feet (30 to 90 cm). The filaments were stacked into bundles, approximately 1.5 inches flat to flat, drawn and restacked and redrawn until the desired channel diameter was achieved. Just before the final draw, a cladding was added for strength and to facilitate handling by placing the bundle inside a hollow tube (usual Corning 0120 glass) and drawing under vacuum. To relieve the stress, the glass composition was annealed after each draw. The glass was then cut to the desired length, polished and etched in a weak acid such as 1% HCl, $HNO_3$ or acetic acid to remove the channel glass and leave behind the porous matrix glass and cladding.

EXAMPLE II

Hexagonal monofilaments of Corning 0120 glass and Detector Technology's EG-2 were used as the inert glass and etchable glass filaments, respectively. The monofilaments, typically 0.01 to 0.1 inches (0.025 to 0.25 cm) in width were stacked in a predetermined pattern which can be used to make arrays. After the monofilaments were stacked, the process was essentially the same as described in Example I. An advantage to using this technique is that one less draw is required in which the dissimilar filaments are in contact with each other at elevated temperatures, greatly reducing the diffusion of glasses into one another and yielding a stronger matrix as well as finer resolution, especially at glass dimensions around 10 nanometers. Another advantage is that individual pixel replacement is possible with a variety of glass types making very complex structures possible. For purposes herein, glass is a non-crystalline substance formed usually by the fusion of the constituent materials followed by cooling to yield a supercooled solution which most closely resembles a rigid liquid. Quantum dot structures have a thickness in the range of 1 to 500 nanometers and quantum wire structures have thickness in the range of infinitely long and as long as a centimeter, preferably greater than 200 microns. Electronic devices of the type disclosed herein can be on the order of several centimeters, depending on the application.

What is claimed is:

1. A mesoscopic structure made by a method comprising the steps of:
    forming a glass block of an acid inert glass having acid etchable glass rods extending therethrough, the acid etchable glass rods having an average diameter of less than 1 micron;
    partially etching one end of the acid etchable rods to form cavities in the glass block on one surface of thereof having an average diameter of less than 1 micron;
    depositing a first deposition material selected from the group consisting of conductors, semiconductors and insulators in the cavities to form a mesoscopic structure.

2. A mesoscopic structure made according to claim 1, wherein said method further comprises the steps of:
    at least partially etching a second end of the acid etchable rods to form second cavities on a second surface of the glass block, the second cavities having an average diameter of less than 400 Å;
    depositing a second deposition material selected from the group consisting of insulators, conductors and semiconductors and different from the first deposition material in the second cavities to form a mesoscopic structure containing dissimilar deposition materials.

3. The produce of claim 1, wherein said first deposition material is selected from the group consisting of metals and semiconductors.

4. The method of claim 3, wherein said second deposition material is selected from the group consisting of insulators, conductors and semiconductors.

5. A mesoscopic structure made by a method comprising the steps of:
    forming a glass block of an acid inert glass having acid etchable glass rods extending therethrough, the acid etchable glass rods having an average diameter of less than 1 micron;
    etching the acid etchable rods in the glass block to form channels therethrough having an average diameter of less than 1 micron;
    depositing semiconductor material in the channels to substantially fill the channels and form an oriented array of semiconductor material.

6. A mesoscopic structure according to claim 5, wherein said method comprises the steps of:
    masking a plurality of the acid etchable rods to prevent the rods from being etched;
    etching the non-masked etchable rods to form first channels;
    depositing a first deposition material selected from the group consisting of insulators, conductors and semiconductors to substantially fill the first channels to form an oriented array of the first deposition material;

removing the masking from the masked etchable rods;

etching the previously masked etchable rods to form second channels;

depositing a second deposition material selected from the group consisting of insulators, conductors and semiconductors and different from the first deposition material to fill the second channels and to form a mesoscopic structure having a oriented array of two dissimilar deposition materials, wherein at least one of said first deposition material and said second deposition material is said deposited semiconductor material.

7. A mesoscopic structure comprising a nanochannel glass matrix including an array of channels therethrough having an average diameter of less than 1 micron and a semiconductor material which is quantum confined by said glass channels.

8. A mesoscopic structure according to claim 7, wherein said channels have at least two different sized diameters and said semiconductor material emits a different wavelength of light depending on the diameter of the respective channel in which said semiconductor material is quantum confined.

9. A mesoscopic structure according to claim 8, wherein wavelengths of light correspond to red, green and blue emissions.

10. A mesoscopic structure according to claim 8, wherein said channels are arranged in groups of three different diameters.

11. A mesoscopic structure comprising a nanochannel glass matrix including an array of channels therethrough having a average diameter of less than 1 micron and a semiconductor material which is quantum confined in said glass channels and which becomes charged when said semiconductor material absorbs light of a given wavelength.

12. A mesoscopic structure according to claim 11, wherein said channels have at least two different sized diameters and said semiconductor material absorbs a different wavelength of light depending on the diameter of the respective channel in which said semiconductor material is quantum confined.

13. A mesoscopic structure according to claim 11, wherein said channels have at least two different sized diameters, said semiconductor material emits a different wavelength of light depending on the diameter of the respective channel in which said semiconductor material is quantum confined, and wherein said mesoscopic structure comprises an input/output device.

14. A mesoscopic structure comprising:
a nanochannel glass matrix including channels having a diameter of less than 1 micron;
an oriented crystalline substrate adjacent to one end of said channels;
an oriented crystalline material filling said channels and contacting said substrate; and
an oriented array of quantum wires of semiconductor material extending from exposed ends of said oriented crystalline material filling said channels.

15. A mesoscopic structure according to claim 14, wherein said quantum wires are coated with a first semiconductor material coating.

16. A mesoscopic structure according to claim 14, wherein said quantum wires are coated with two layers of dissimilar semiconductor material.

17. A mesoscopic structure according to claim 16, wherein said two coating layers are concentric.

18. A mesoscopic structure according to claim 16, wherein said two coating layers are non-concentric.

19. A mesoscopic structure according to claim 14, wherein said quantum wires are disposed at an angle to said channels by arranging the crystallographic orientation of said substrate.

20. A mesoscopic structure according to claim 19, wherein said mesoscopic structure is a coherent phase locked light source.

* * * * *